(12) United States Patent
Rueger et al.

(10) Patent No.: US 7,279,377 B2
(45) Date of Patent: Oct. 9, 2007

(54) METHOD AND STRUCTURE FOR SHALLOW TRENCH ISOLATION DURING INTEGRATED CIRCUIT DEVICE MANUFACTURE

(75) Inventors: Neal R. Rueger, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/200,694

(22) Filed: Aug. 10, 2005

(65) Prior Publication Data

US 2007/0037341 A1   Feb. 15, 2007

(51) Int. Cl.
*H01L 21/762* (2006.01)
(52) U.S. Cl. ............ 438/222; 438/296; 257/E21.546
(58) Field of Classification Search .......... 438/222, 438/296, FOR. 227; 148/33.2; 257/E21.546
See application file for complete search history.

(56) References Cited

U.S. PATENT DOCUMENTS

| | | | |
|---|---|---|---|
| 4,571,819 A * | 2/1986 | Rogers et al. | 438/430 |
| 5,134,090 A * | 7/1992 | Bean et al. | 438/492 |
| 6,136,687 A | 10/2000 | Lee et al. | 438/624 |
| 6,150,238 A * | 11/2000 | Wu et al. | 438/435 |
| 6,177,329 B1 | 1/2001 | Pang | 438/400 |
| 6,309,958 B1 * | 10/2001 | Okada | 438/624 |
| 6,376,357 B1 | 4/2002 | Onuma | 438/619 |
| 6,399,476 B2 | 6/2002 | Kim et al. | 438/619 |
| 6,406,992 B1 | 6/2002 | Mao et al. | 438/622 |
| 6,451,669 B2 | 9/2002 | Torres et al. | 438/409 |
| 6,489,193 B1 * | 12/2002 | Chen et al. | 438/222 |
| 6,589,861 B2 | 7/2003 | Park et al. | 438/619 |
| 6,791,155 B1 * | 9/2004 | Lo et al. | 257/506 |
| 6,798,038 B2 * | 9/2004 | Sato et al. | 257/510 |
| 6,812,115 B2 * | 11/2004 | Wieczorek et al. | 438/424 |
| 6,909,128 B2 | 6/2005 | Ireland | 257/276 |
| 7,015,116 B1 * | 3/2006 | Lo et al. | 438/437 |
| 2001/0044176 A1 * | 11/2001 | Sanfilippo | 438/225 |
| 2003/0015764 A1 * | 1/2003 | Raaijmakers et al. | 257/424 |
| 2003/0143852 A1 * | 7/2003 | En-Ho et al. | 438/694 |
| 2004/0018696 A1 * | 1/2004 | Wieczorek et al. | 438/431 |
| 2004/0173870 A1 * | 9/2004 | Sato et al. | 257/510 |
| 2004/0241956 A1 * | 12/2004 | Eun et al. | 438/424 |
| 2005/0087833 A1 * | 4/2005 | Schuegraf et al. | 257/506 |

* cited by examiner

*Primary Examiner*—George Fourson

(57) ABSTRACT

A method suitable for use during fabrication of a semiconductor device such as a dynamic random access memory or a flash programmable read-only memory comprises etching through silicon nitride and pad oxide layers and into a semiconductor wafer to form a trench into the wafer. A shallow trench isolation (STI) layer is formed in the opening in the silicon nitride and in the trench in the wafer which will, under certain conditions, form with an undesirable void. The silicon nitride and pad oxide layers are removed, then an epitaxial silicon layer is formed on the silicon wafer between the STI. A gate/tunnel oxide layer is formed on the epitaxial silicon layer, then a word line is formed over the gate/tunnel oxide. The epitaxial silicon layer ensures that some minimum distance is maintained between the gate/tunnel oxide and the void in the STI. Wafer processing may then be continued to form a completed semiconductor device.

14 Claims, 12 Drawing Sheets

METHOD AND STRUCTURE FOR SHALLOW TRENCH ISOLATION DURING INTEGRATED CIRCUIT DEVICE MANUFACTURE

FIELD OF THE INVENTION

This invention relates to the field of semiconductor manufacture and, more particularly, to a method and structure for shallow trench isolation and transistor formation.

BACKGROUND OF THE INVENTION

During the manufacture of a semiconductor device such as a dynamic random access memory (DRAM), a programmable read-only memory (PROM) such as a flash electrically erasable PROM (EEPROM), a microprocessor, etc., various features are formed. For example, adjacent word lines each comprising a plurality of transistors are formed as access devices to electrical charges which may be stored on a plurality of storage capacitors and floating gates.

To reduce electrical interference between adjacent word lines, specifically interference between implanted regions within a semiconductor wafer over which the word lines will be formed, shallow trench isolation (STI) is provided early in semiconductor device processing. To form STI, a pad oxide layer and a silicon nitride layer are formed over the semiconductor wafer, a patterned photoresist layer is formed over the nitride, then the nitride, pad oxide, and semiconductor wafer are etched using the patterned photoresist layer as a mask to form a trench in the semiconductor wafer. The pad oxide reduces damage to the silicon wafer from formation of the nitride, and the nitride reduces oxidation of the wafer. Subsequently, the photoresist layer is removed and an oxide isolation is provided within the trench, typically using a high density plasma (HDP) to provide a blanket layer using a chemical vapor deposition (CVD) process. Subsequently, a mechanical planarization process, typically a chemical-mechanical polishing (CMP) process, is used to planarize the HDP oxide to the upper level of the nitride, which forms a damascene isolation within the trench. The nitride is then removed so that the upper surface of the HDP oxide is at a higher level than the surface of the semiconductor wafer. Various processing is performed to shape the HDP STI oxide, then word lines and other features required for proper device operation are formed during later wafer processing.

With decreasing feature sizes, various problems may occur with trench formation. For example, one such problem results from the relatively high height:width ratio (i.e. "aspect ratio") of the trench to be filled. If the aspect ratio of the opening in the wafer exceeds about 4:1 for a trench which is about 50 nanometers (nm) wide, use of an HDP-CVD process will result in a void in the STI film. Voids in the isolation are to be avoided as they negatively affect the electrical operation of transistors adjacent the trench isolation. Typically, the top of the void should be separated from the gate oxide (for example for use with a dynamic random access memory device) or tunnel oxide (for example for use with a flash programmable read only memory device) by a minimum distance of at least about 500 to 800 angstroms (Å) to reduce or eliminate adverse electrical effects. Forming a deeper trench may not resolve the problem, as a larger void may form which extends to the same height as a void in the shallower trench.

For a given integrated circuit design, a void buried in the STI fill to a sufficient depth may be successfully achieved for most of the array structures. However, when statistically significant variations in critical dimensions are present, there are likely to be instances where the top of the buried void is too shallow for acceptable device performance.

A method for forming trench isolation which reduces or eliminates the problems described above, and an inventive structure resulting from the method, would be desirable.

SUMMARY OF THE INVENTION

The present invention provides a method which, among other advantages, reduces problems associated with the manufacture of semiconductor devices, particularly problems resulting from void formation within shallow trench isolation (STI). In one embodiment of the inventive method, a blanket layer of pad oxide then a blanket layer of silicon nitride are formed over a semiconductor wafer. The silicon nitride layer, pad oxide layer, and semiconductor wafer are etched using a patterned mask to form an opening through the silicon nitride and pad oxide layers, and to form a trench within the semiconductor wafer.

Next, a blanket silicon dioxide layer is formed over the silicon nitride and within the trench in the semiconductor wafer, for example using a high density plasma (HDP) chemical vapor deposition (CVD) process. With a trench width of about 50 nanometers or less and an aspect ratio of about 4:1 or greater, a void will likely form in the HDP-CVD oxide.

The HDP oxide is planarized to a level of the top of the silicon nitride, for example using an isotropic etch or, preferably, a chemical mechanical polishing process. Subsequently, the silicon nitride and pad oxide are removed to expose the wafer and to leave the HDP oxide substantially intact. An epitaxial silicon layer is formed to contact the semiconductor wafer at locations between the trenches and between the HDP oxide. A gate/tunnel oxide is formed on the epitaxial layer, then wafer processing is continued to form a word line over the epitaxial layer and on the gate/tunnel oxide.

Forming the epitaxial layer on the semiconductor wafer, then the gate/tunnel oxide and the word line on the epitaxial layer ensures that the gate/tunnel oxide is spaced farther from the void in the HDP oxide than would forming the gate or tunnel oxide directly on the semiconductor wafer. This results in a transistor having more desirable electrical properties than if the transistor was formed directly on the semiconductor wafer.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
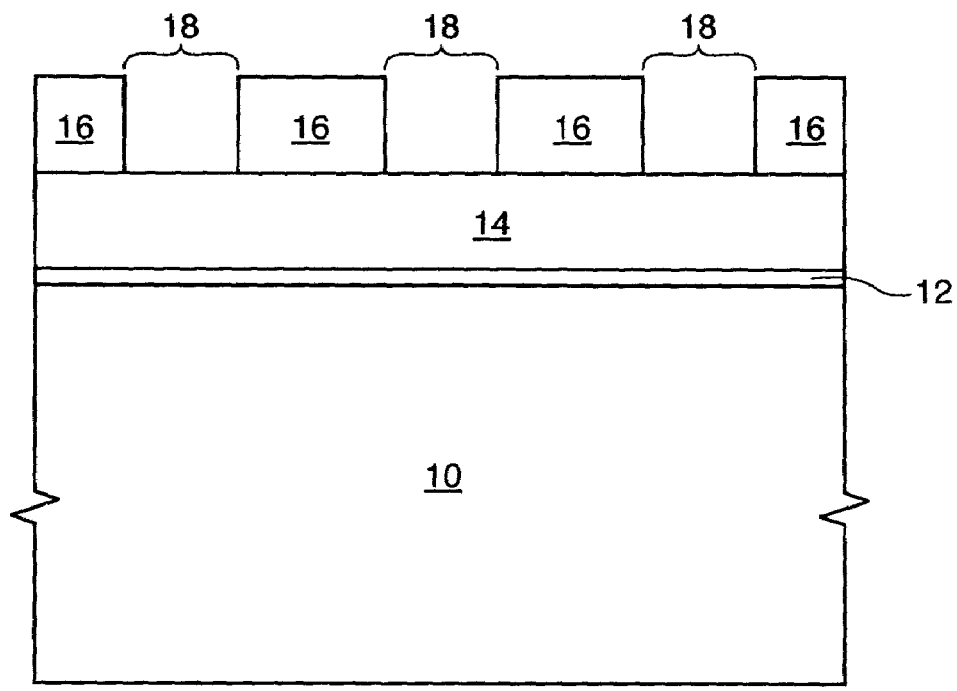
FIGS. 1-7 are cross sections of various in-process structures formed during an embodiment of the present process.

A first embodiment of an inventive method for forming isolation such as shallow trench isolation is depicted in FIGS. 1-7. FIG. 1 depicts an assembly comprising a semiconductor wafer 10, a pad layer 12, for example silicon dioxide between about 30 angstroms (Å) and about 70 Å thick, and a layer 14, for example silicon nitride between about 250 Å and about 1,000 Å thick. The pad oxide reduces damage to the wafer during formation of the silicon nitride, and the silicon nitride functions as a sacrificial vertical spacing layer and reduces oxidation of the semiconductor wafer. As the target thickness of the $Si_3N_4$ vertical spacing layer increases, the distance between a void in a subsequently formed shallow trench isolation (STI) layer and a gate dielectric layer may also increase, depending on STI processing. Thus at 1,000 Å thickness of the vertical spacing layer, the gate oxide may be at least 1,000 Å from the void, if the void is formed at the top of the STI. The vertical spacing layer is "sacrificial" as all portions of the layer may be completely removed subsequent to its formation without negatively affecting the operation of the completed device. FIG. 1 further comprises a masking layer 16, for example a patterned photoresist layer, having openings 18 therein which will define openings in the nitride 14, pad oxide 12, and wafer 10. It should be noted that features such as doped wells, combis, and other structural details may be present which are not immediately germane to the present invention and are not depicted or discussed for simplicity of explanation.

The silicon nitride 14, pad oxide 12, and semiconductor wafer 10 are etched to form an opening between about 1,000 Å and about 4,000 Å deep into the wafer. The openings in the silicon nitride 14, pad oxide 12, and semiconductor wafer 10 are all congruent, each with the others. The mask 16 is removed, then a blanket silicon dioxide isolation layer 20 such as an STI layer is formed to result in the structure of FIG. 2. The STI layer 20 may be formed using a high density plasma chemical vapor deposition (HDP-CVD) process, typically having a target thickness of at least half the diameter of the opening so that the STI oxide bridges the opening in the wafer. Thus for an opening having a diameter of 50 nanometers (nm), the target thickness of the STI layer will be at least 25 nm. Another target scheme for the STI layer thickness may comprise targeting the total structure depth plus 600 Å.

In this embodiment, the depth of the opening through the silicon nitride 14, pad oxide 12, and into the wafer 10 is more than four times the diameter of the opening and results in an opening having an aspect ratio of greater than 4:1. For an opening having a diameter of 50 nm, the depth of the opening will be 200 nm or greater. With an aspect ratio of at least 4:1 and an opening having a diameter of 50 nm or less, a void 22 will form within the oxide 20. The location of the void within the trench, as well as the cross sectional area of the void, will depend on the width and depth of the opening and the process used to form the STI oxide. Thus with statistical variations in various trenches formed across the wafer, the location and size of the void may vary. In any case, a void within a trench may negatively affect the electrical characteristics of a semiconductor device if the distance between the top of the void and the bottom of a gate/tunnel oxide layer is less than about 800 angstroms (Å), and is particularly detrimental if the distance between the top of the void and the bottom of the gate/tunnel oxide is less than about 500 Å.

For purposes of this disclosure, "gate dielectric layer" is used to refer to a dielectric such as an oxide which is formed to be part of a transistor and has a portion which is (or will be) interposed between a transistor channel and a transistor gate. Thus the "gate dielectric layer" may comprise gate oxide or tunnel oxide, and the gate may be a word line or a floating gate.

Figure 2:
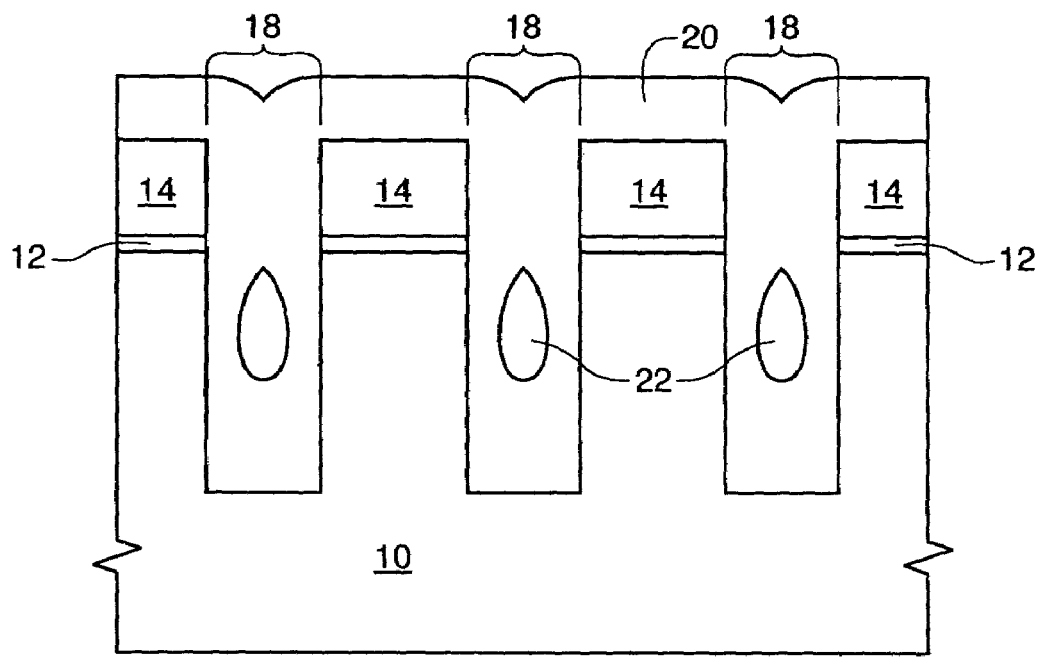
Figure 3:
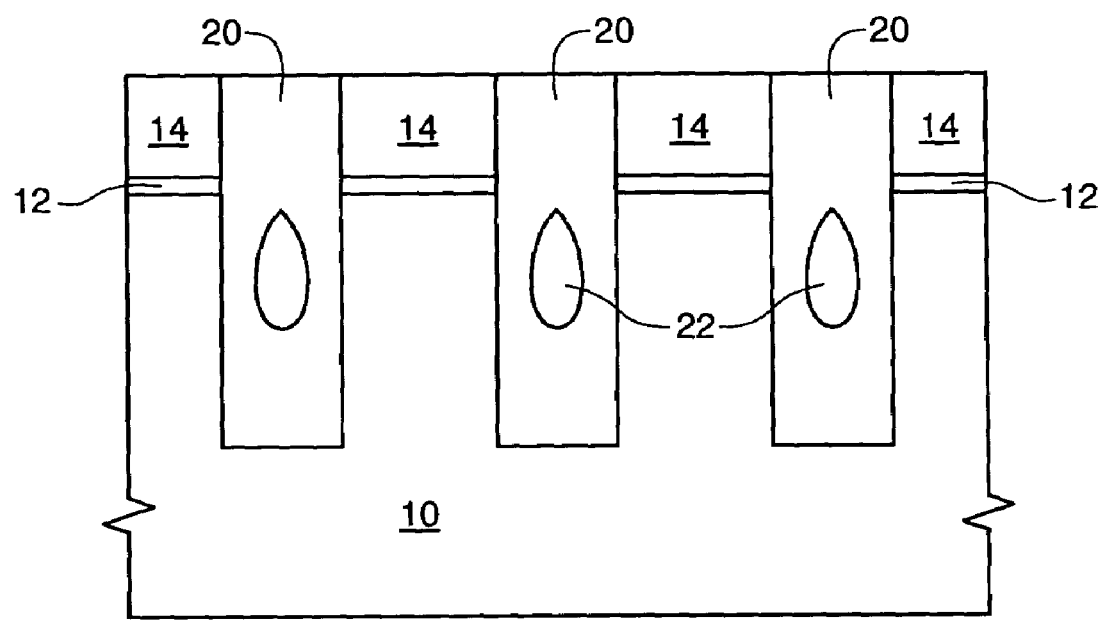

After forming the FIG. 2 structure, the STI is planarized as depicted in FIG. 3 to remove the portion of the STI oxide 20 formed over the upper surface silicon nitride 14. The STI may be planarized using a mechanical planarization process, such as chemical mechanical polishing (CMP).

Figure 4:
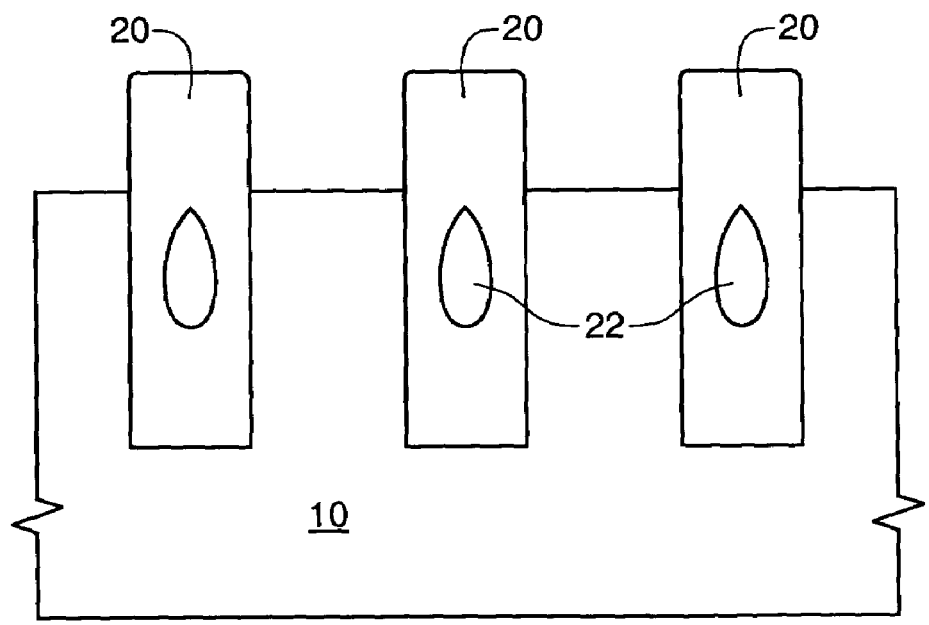

In this embodiment, the vertical spacing layer 14 occupies a future transistor channel location. After planarizing the STI to the desired level, the silicon nitride 14 and pad oxide 12 are removed to result in the structure of FIG. 4 having HDP oxide protruding from the wafer surface. During the etch of the silicon nitride 14 and, particularly, the pad oxide 12, the HDP STI oxide 20 may also be somewhat etched to result in rounding of the corners as depicted in FIG. 4. In this embodiment the STI oxide extends above the surface of the semiconductor wafer by between about 250 Å and about 1,000 Å.

In another embodiment, the silicon nitride 14, and pad oxide 12 are removed during the planarization of the HDP STI to expose the semiconductor wafer. Any required modification to the process described below to continue with this other embodiment may be determined by one of ordinary skill in the art from the description herein.

Figure 5:
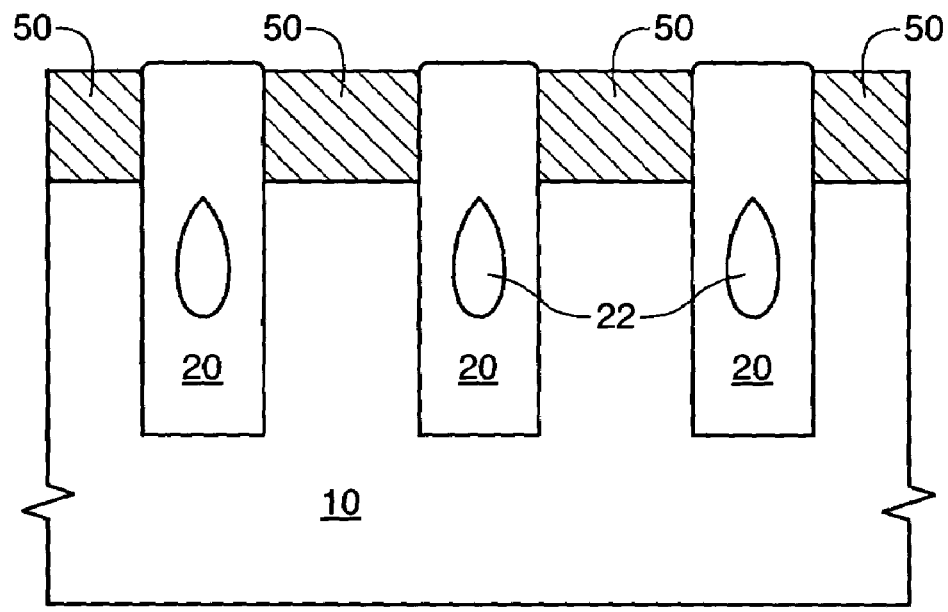

After forming the FIG. 4 structure, an epitaxial silicon layer 50 is formed on the exposed portions of the semiconductor wafer 10 to result in the structure of FIG. 5. The epitaxial silicon layer 50 is formed to be laterally located with respect to the STI, and is formed to a thickness of between about 500 Å and about 1,000 Å. This thickness is between about 100 Å and about 500 Å less than the distance the STI protrudes from the semiconductor wafer, thus the STI oxide will protrude from the epitaxial silicon layer by between about 100 Å and about 500 Å such that an upper surface of the HDP STI is above an upper surface of the epitaxial layer. In another embodiment, the epitaxial silicon layer may be formed to have an upper surface about level with an upper surface of the HDP STI layer. The epitaxial silicon layer 50 may be formed by exposing the FIG. 4 structure, particularly the silicon wafer 10, to an environment which comprises introducing dichlorosilane ($SiH_2Cl_2$) at a flow rate of between about 150 standard $cm^3$/minute (sccm) and about 250 sccm, along with $H_2$ at a flow rate of about 40 standard liters/minute (SLM) and HCl at a flow rate of about 160 sccm. The flow is performed at a temperature of between about 800° C. and about 900° C. The epitaxial silicon layer forms at a rate of about 5 Å/minute, and thus the process is performed for a duration of between about 100 minutes and about 200 minutes to result in a smooth epitaxial layer having a thickness in the range of about 500 Å to about 1,000 Å. The epitaxial silicon layer may be conductively doped with ions either during or after its formation to optimize the electrical properties of the layer, for example to optimize the use of the epitaxial layer 50 as a transistor channel region for a subsequently completed transistor.

Figure 6:
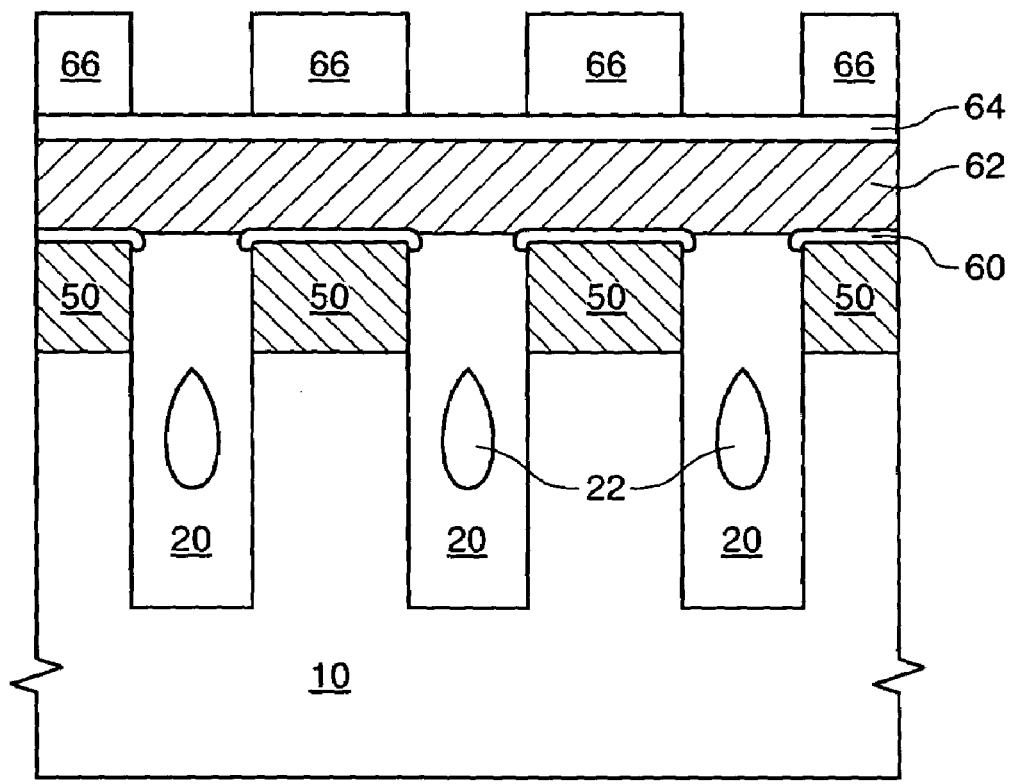

An isotropic oxide etch of the FIG. 5 structure may be performed to result in the profile of the STI 20 as depicted in FIG. 6. In the present embodiment, between about 1 Å and about 100 Å of oxide is targeted for removal. This oxide etch shapes the upper surface of the STI so that the edge of the epitaxial silicon 50 is exposed during growth of the gate dielectric layer, which helps to optimize the shape of the gate dielectric around the corner of the epitaxial silicon 50.

After shaping the STI 20 through an isotropic oxide etch to result in the general cross sectional profile depicted in FIG. 6, a gate dielectric layer 60 is grown over exposed surfaces of the epitaxial silicon 50 using any suitable process. One or more planarized layers of transistor gate material 62, such as a layer of polysilicon then a tungsten silicide layer, are formed over the transistor gate material, then a capping oxide layer 64, such as silicon nitride, is formed on the transistor gate material 62. A patterned mask 66 which will define transistor gate stacks is then formed over the capping layer 64.

Figure 7:
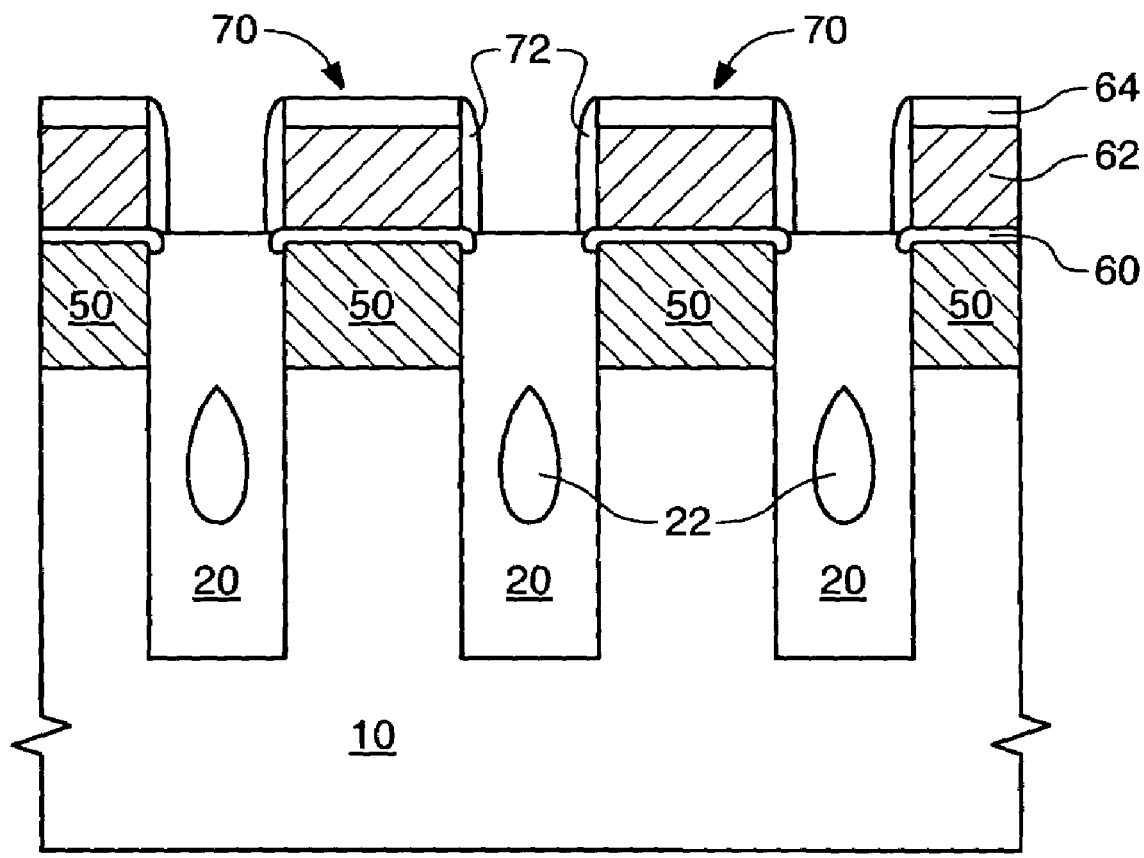

Subsequently, the FIG. 6 structure is etched to form transistor gate stacks 70 as depicted in FIG. 7 from the dielectric layers 60, 64 and the conductive layer(s) 62. After etching the FIG. 6 structure, any required implant is performed, for example to implant the wafer around the transistor at different wafer locations than those depicted in FIG. 7. Next, a blanket conformal dielectric layer such as silicon nitride is deposited and anisotropically etched using a spacer etch to form spacers 72 as depicted. Semiconductor wafer processing is then continued according to techniques known in the art.

Forming the transistors 70 on the epitaxial silicon layer 50, particularly the gate dielectric layer 60, increases the distance from the top of the voids 22 to the bottom of the gate dielectric layer 60 beyond that found without formation of the epitaxial layer, and improves electrical characteristics of the transistors. As depicted, a first distance from the top of the voids 22 to the bottom of the epitaxial layer 50 is less than a second distance from the top of the voids 22 to the bottom of the gate dielectric layer 60.

Figure 8:
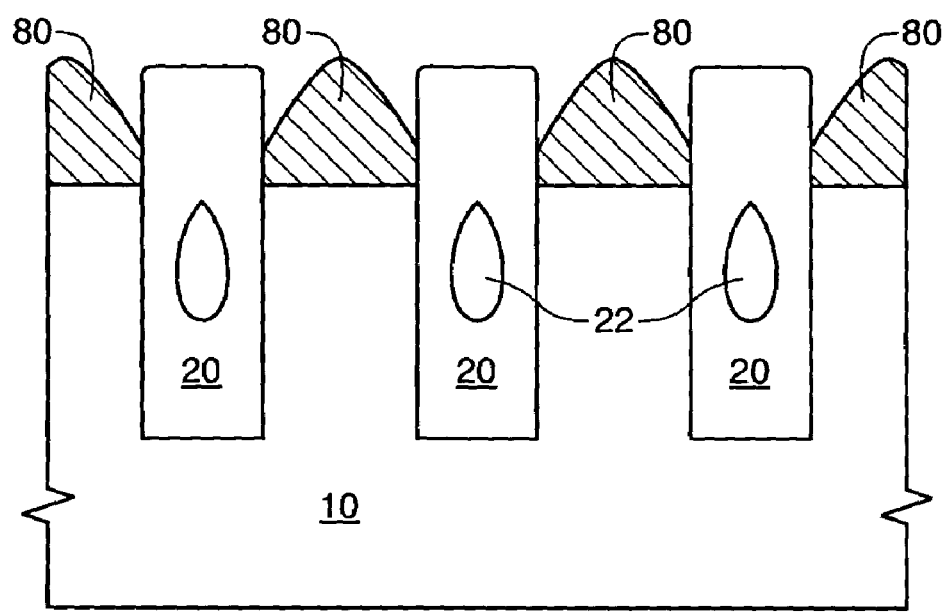
FIG. 8 is a cross section depicting an in-process structure formed during a first alternate embodiment of the present process.

Alterations may be made during formation of the epitaxial layer to customize the shape and to change the electrical characteristics of the cell formed on the epitaxial layer, or the shape may be customized through an etch. FIG. 8 depicts an epitaxial silicon layer 80 formed to have a more conical shape than epitaxial layer 50 of FIG. 5, for example. To form layer 80, the process described above to form layer 50 is altered by optimizing chamber temperature and pressure during deposition of the epitaxial layer 50. This may result in a cell having a longer channel region, and may reduce the instance of the short channel effect. In a device having a floating gate, the profile for the epitaxial silicon layer 80 depicted in FIG. 8 may improve programming and/or erase characteristics by creating a sharp channel which improves electron injection through the tunnel oxide.

Figure 9:
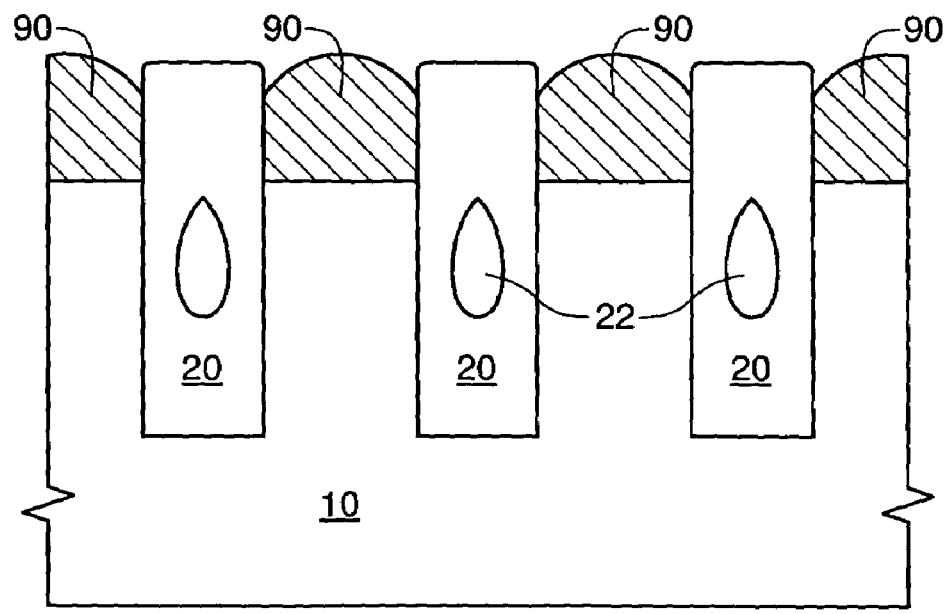
FIG. 9 is a cross section depicting an in-process structure formed during a second alternate embodiment of the present process

In another process, a more rounded profile is provided, for example such as layer 90 of FIG. 9. To form layer 90, the process described above to form layer 50 is modified by optimizing the chamber temperature and pressure during deposition of the epitaxial layer 50. This more rounded profile, as described for the conical profile of epitaxial silicon layer 80, increases the channel length and may provide for a more uniformly doped channel than would be possible with the conical profile.

By adjusting and optimizing the temperature and pressure within a deposition chamber during the formation of the epitaxial silicon layer, the epitaxial silicon layer may be formed with various profiles such as the flat, conical, or rounded profiles depicted in FIGS. 5, 8, and 9. The various profiles may be formed by one of ordinary skill in the art from the description herein.

Another embodiment of the invention is depicted in FIGS. 10-18, for example which forms a dynamic random access memory (DRAM) device. Many of the structures formed during this embodiment may be formed simultaneously with similar features formed during the embodiment depicted in FIGS. 1-7. Further, while the FIGS. depict a single gate transistor, the process may be altered easily by one of ordinary skill in the art to form a floating gate device such as flash memory.

Figure 10:
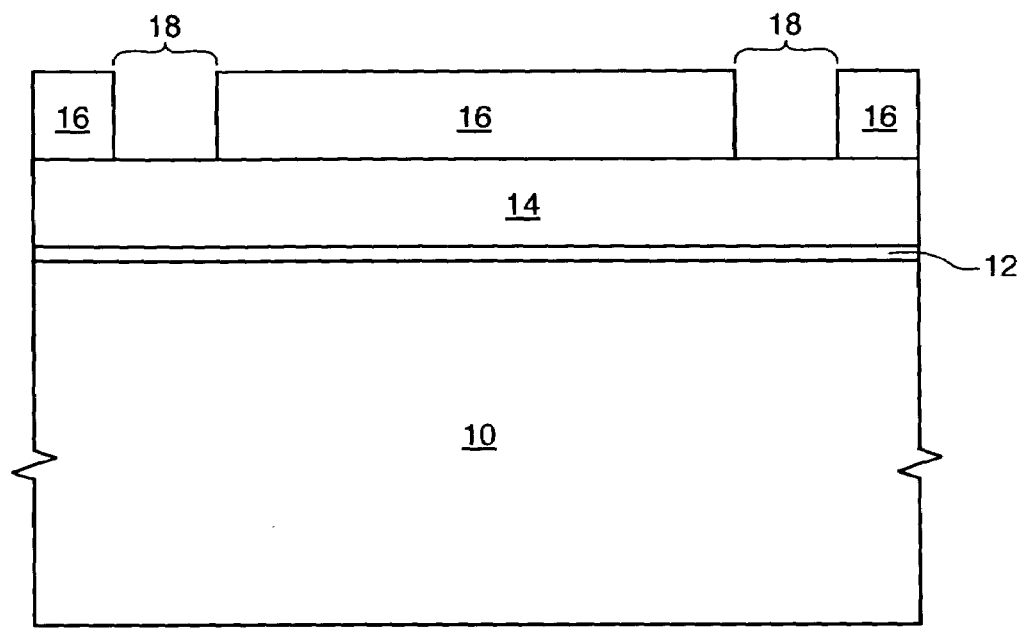
FIGS. 10-18 are cross sections of another embodiment of the invention.
Figure 11:
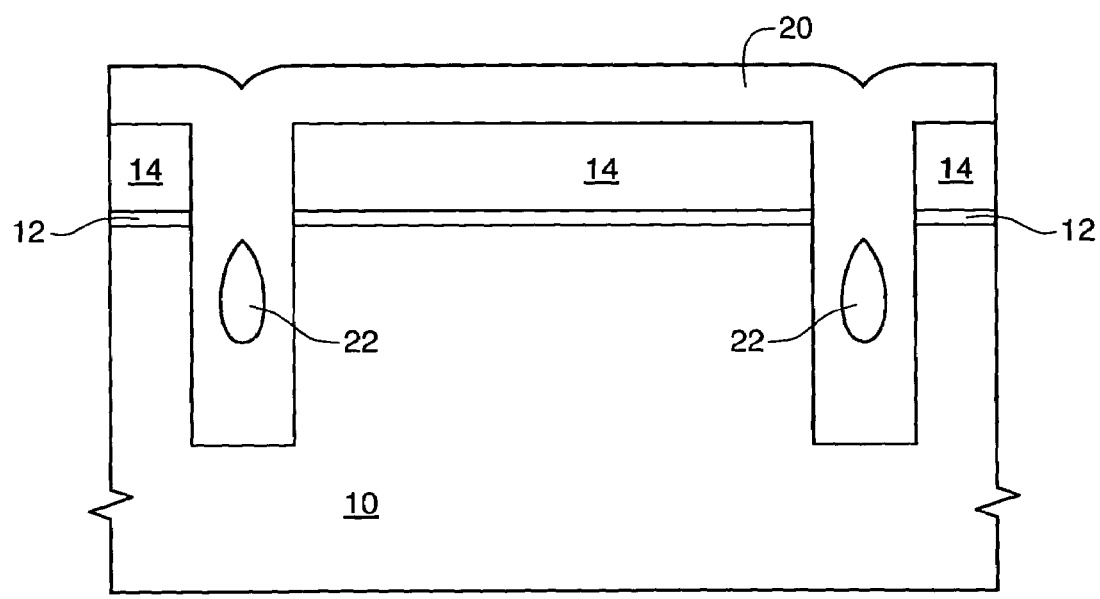

FIG. 10 depicts a semiconductor wafer 10, a pad oxide layer 12, a silicon nitride layer 14, and a patterned photoresist layer 16 having openings 18 therein. An etch is performed on the FIG. 10 structure to etch the exposed portions of the silicon nitride layer 14 and the pad oxide 12, and to etch at least partially into the semiconductor wafer 10. Next, the photoresist 16 is removed and a blanket STI layer is formed, for example using a HDP-CVD process as described for the previous embodiment to form silicon dioxide layer 20 as depicted in FIG. 11. As with the previous embodiment, voids 22 will form in the HDP STI layer 20, particularly when the aspect ratio of the opening is greater than about 4:1 and when the diameter of openings 18 are less than about 50 μm. If the voids 22 cannot be avoided, or are intentionally formed, for example to decrease electrical conductivity, any gate dielectric layer should be a minimum distance from the voids to ensure proper electrical operation of a completed transistor device.

Figure 12:
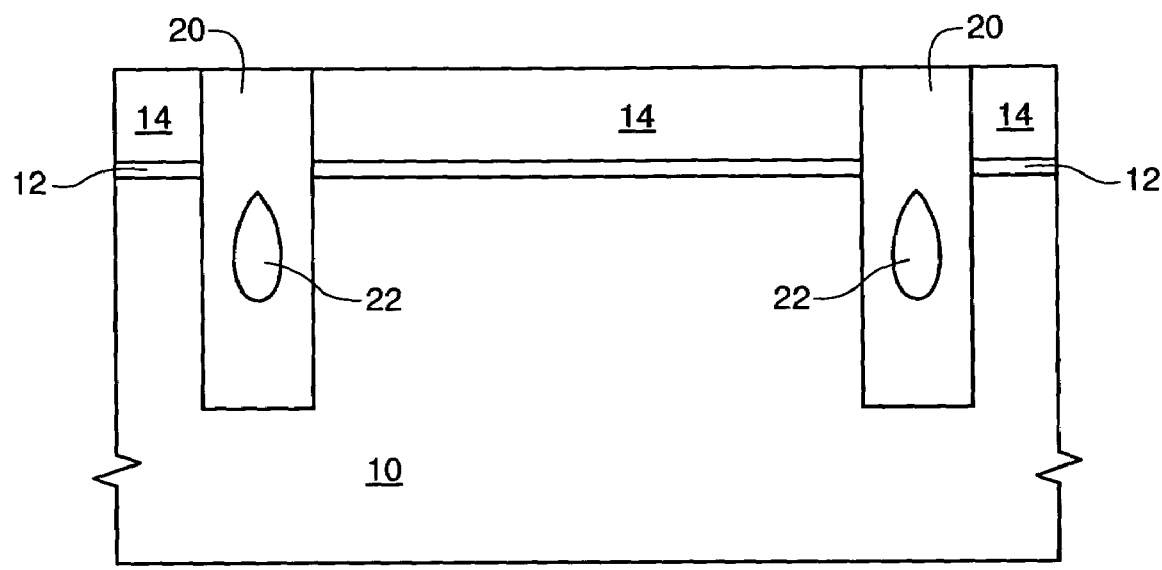

The FIG. 11 structure is then planarized, for example using mechanical planarization such as chemical mechanical planarization (CMP), a chemical etch, or a mechanical etch with an inert component such as argon to result in the structure of FIG. 12.

Figure 13:
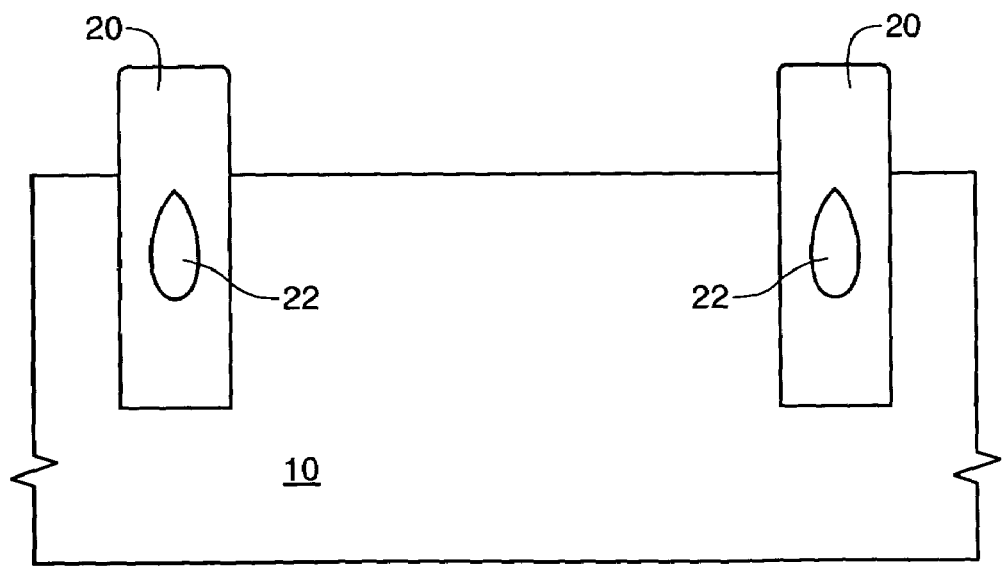
Figure 14:
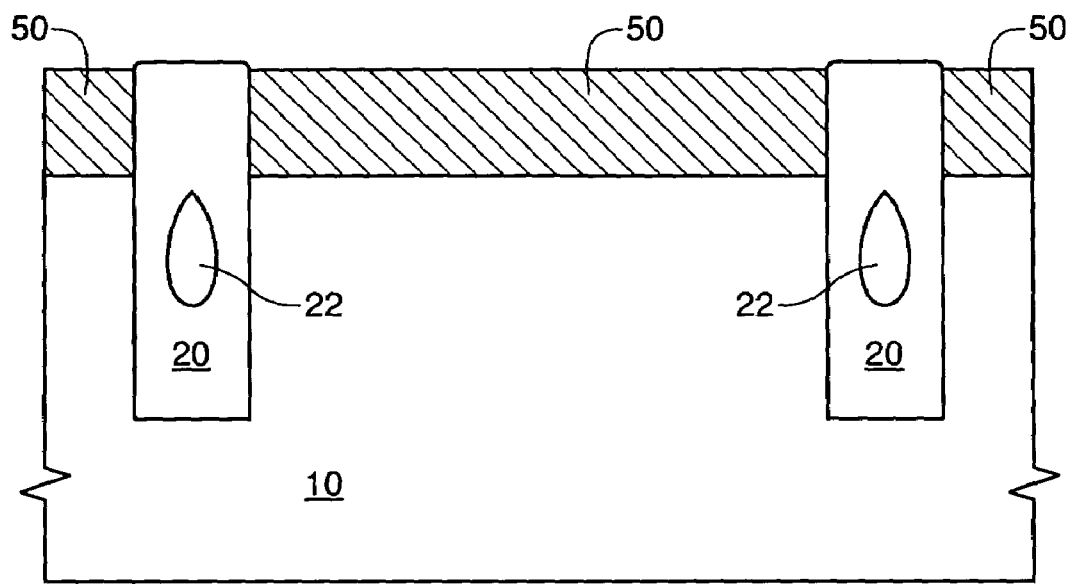

Next, the silicon nitride 14 and pad oxide 12 are removed to result in the FIG. 13 structure, then an epitaxial layer 50 such as epitaxial silicon is formed to result in the structure of FIG. 14. If desired, the epitaxial layer 50 may be doped either during or subsequent to its formation, depending on the type of device which is being formed. The thickness of the epitaxial layer 50 depends on the device being formed, but typically will be about as thick or slightly thinner (for example between about 50 Å to about 100 Å thinner) than the STI 20 protrudes from the wafer 10.

Figure 15:
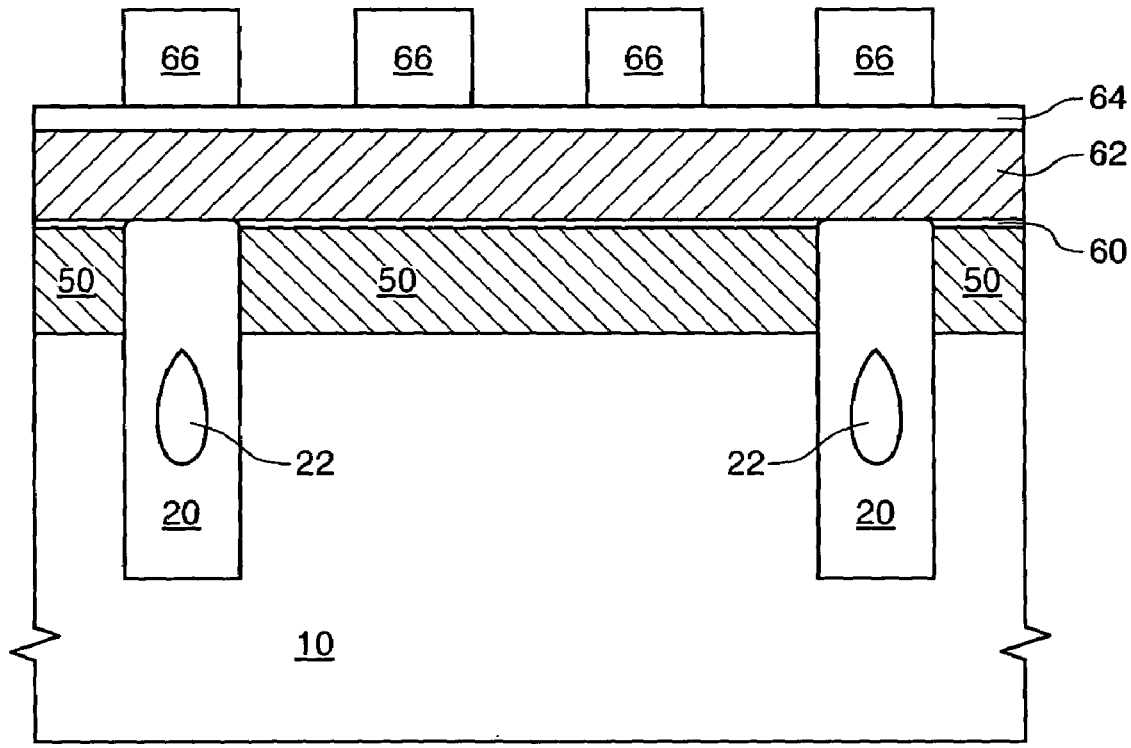
Figure 16:
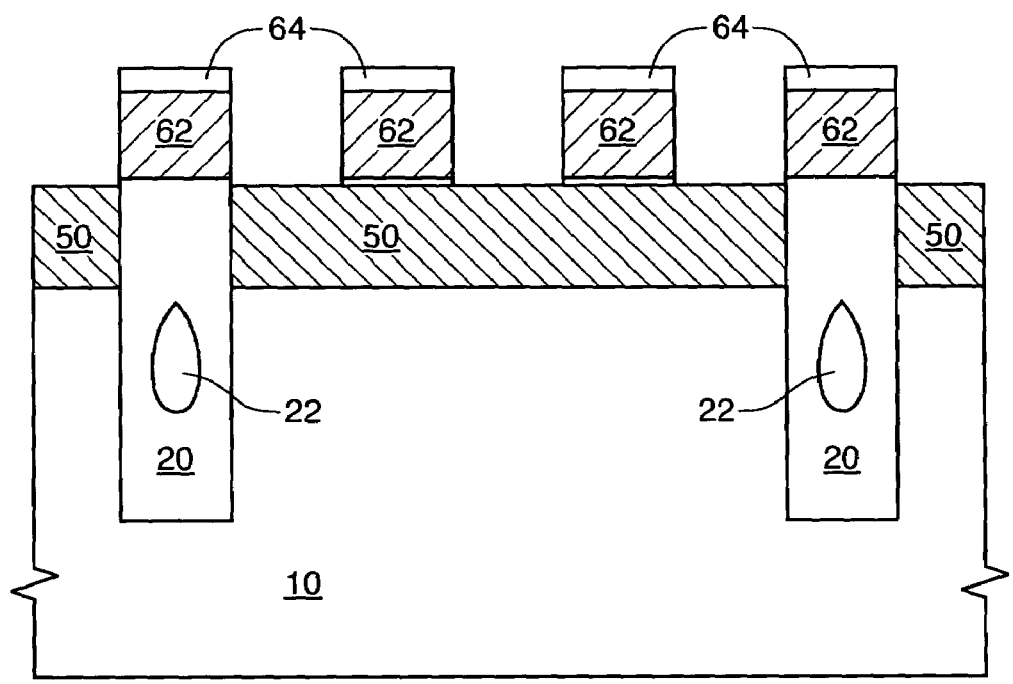
Figure 17:
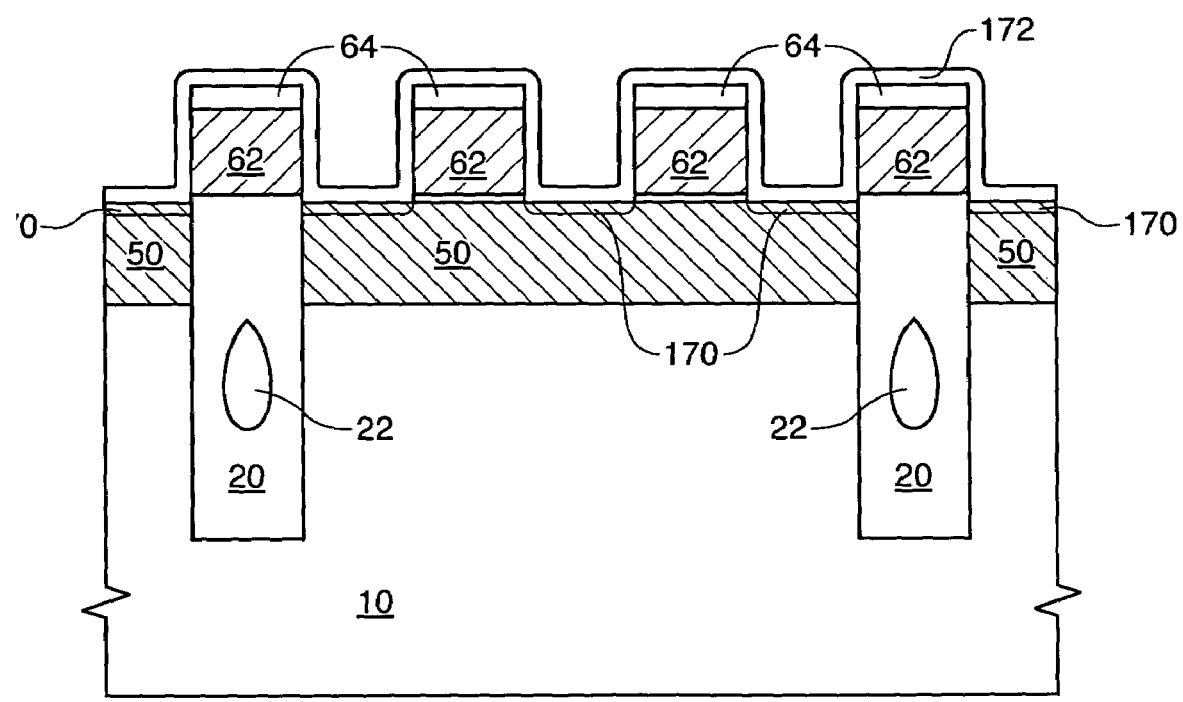
Figure 18:
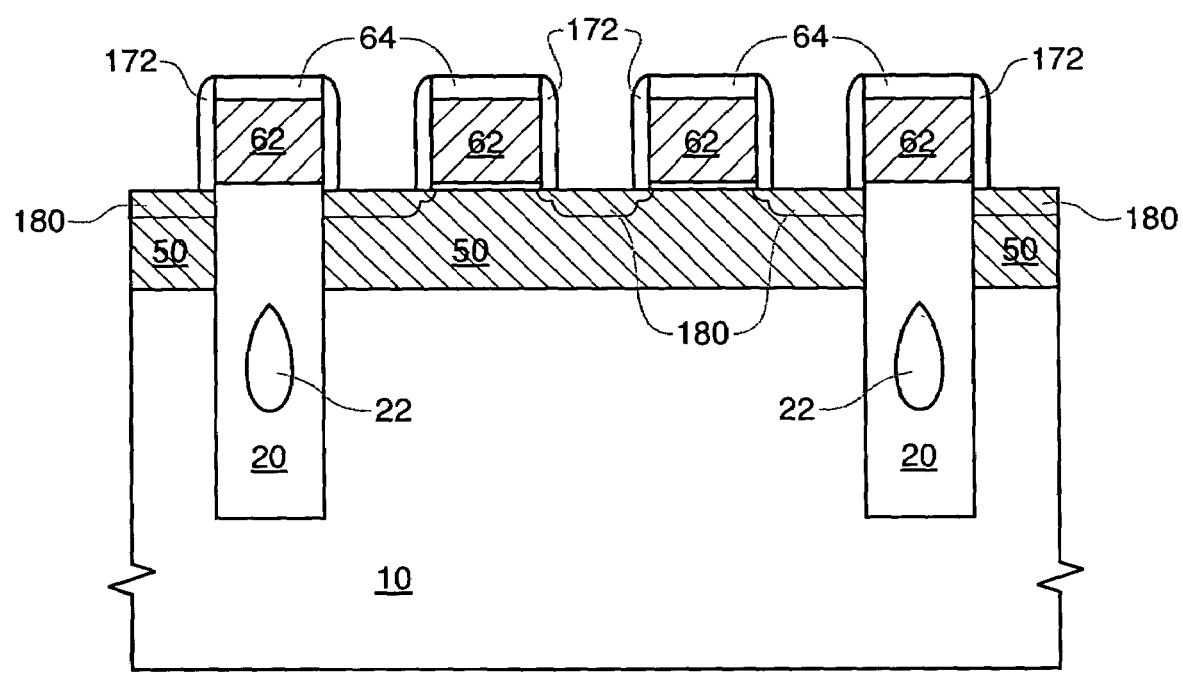

After forming the epitaxial layer 50, a gate dielectric layer 60, one or more conductive transistor gate layers 62 such as doped polysilicon and tungsten silicide, and a dielectric transistor capping layer 64 such a silicon nitride are formed over the epitaxial layer 50 as depicted in FIG. 15. A patterned photoresist layer 66 is formed, which will define the transistor gates (word lines). An etch of the exposed layers of FIG. 15 is performed down to, or extending through, the gate oxide 60, and the photoresist layer 66 is removed to result in the FIG. 16 structure. A source/drain implant is performed to result in doped region 170 within the epitaxial layer, then a spacer layer 172, for example a blanket silicon layer, is formed as depicted in FIG. 17. An anisotropic spacer etch is performed to result in the completed transistors of FIG. 18, then another implant into the epitaxial layer 50 may be performed to result in the completed source/drain regions 180 as depicted in FIG. 18.

Figure 19:
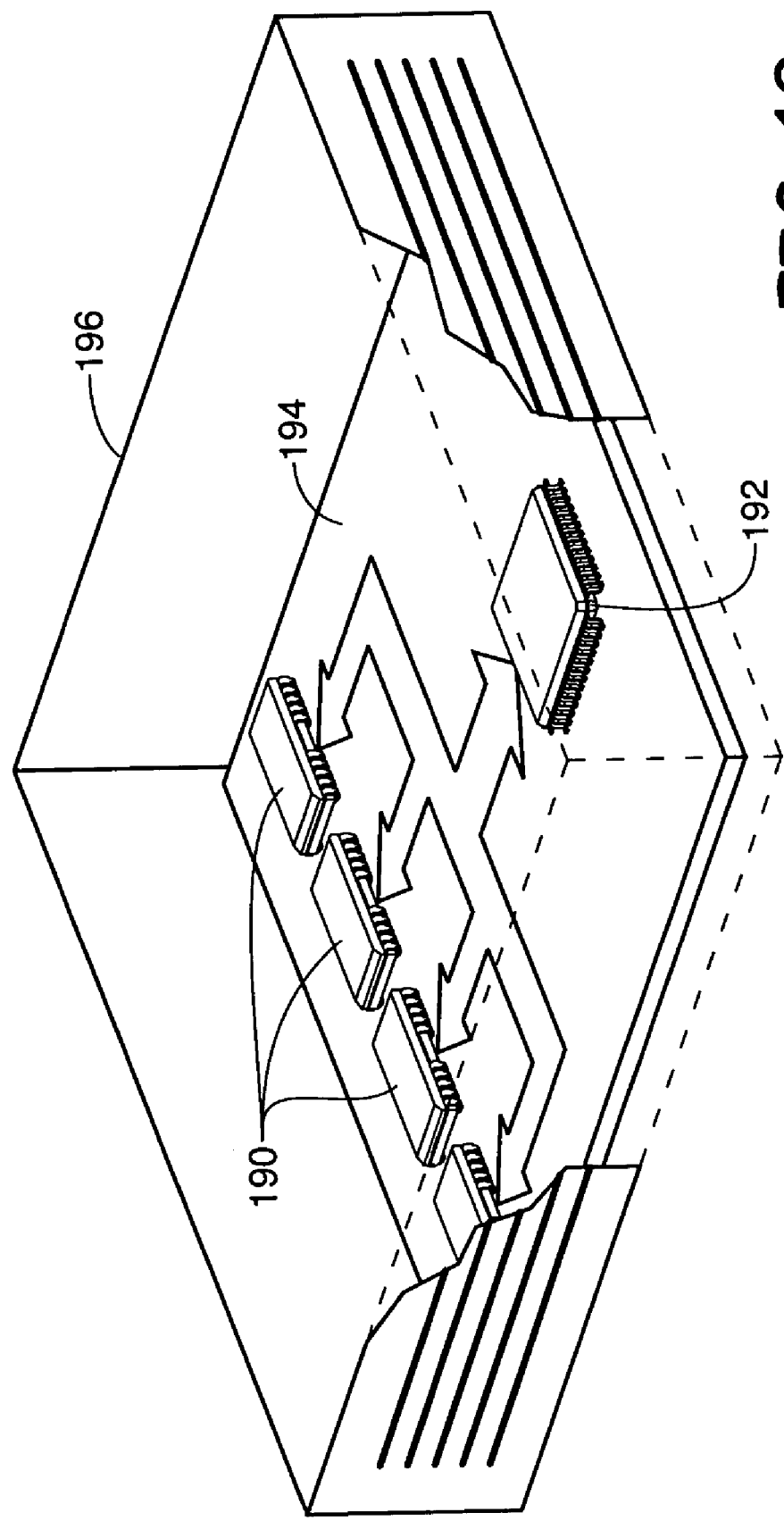
FIG. 19 is an isometric depiction of various components which may be manufactured using devices formed with an embodiment of the present invention.

As depicted in FIG. 19, a semiconductor device 190 formed in accordance with the invention may be attached along with other devices such as a microprocessor 192 to a printed circuit board 194, for example to a computer motherboard or as a part of a memory module used in a personal computer, a minicomputer, or a mainframe 196. FIG. 19 may also represent use of device 190 in other electronic devices comprising a housing 196, for example devices comprising a microprocessor 192, related to telecommunications, the automobile industry, semiconductor test and manufacturing equipment, consumer electronics, or virtually any piece of consumer or industrial electronic equipment.

Figure 20:
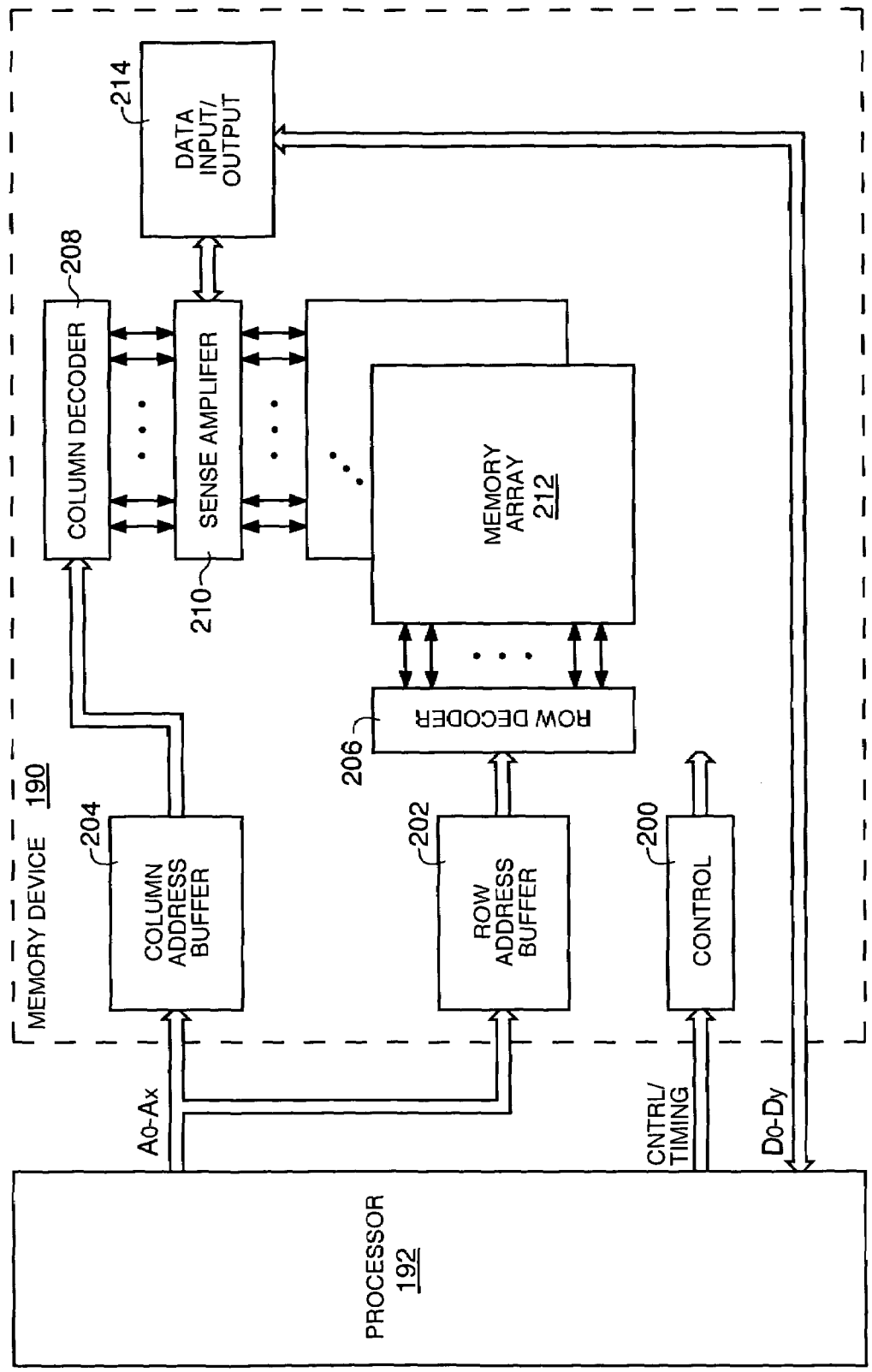
FIG. 20 is a block diagram of an exemplary use of the invention to form part of a memory device having a storage transistor array.

The process and structure described herein may be used to manufacture a number of different transistors comprising an epitaxial silicon layer formed according to the inventive process. FIG. 20, for example, is a simplified block diagram of a memory device such as a dynamic random access memory having transistors which may be formed on an epitaxial silicon layer using an embodiment of the present invention. The general operation of such a device is known to one skilled in the art. FIG. 20 depicts a processor 192 coupled to a memory device 190, and further depicts the following basic sections of a memory integrated circuit: control circuitry 200; row 202 and column 204 address buffers; row 206 and column 208 decoders; sense amplifiers 210; memory array 212; and data input/output 214.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for use during fabrication of a semiconductor device, comprising:
   providing a semiconductor wafer substrate assembly comprising at least a portion of a semiconductor wafer;
   forming a vertical spacing layer over the semiconductor wafer substrate assembly;
   etching at least one opening through the vertical spacing layer and at least partially into the semiconductor wafer substrate assembly;
   forming a trench isolation layer within the opening through the vertical spacing layer and within the opening in the semiconductor wafer substrate assembly, wherein the trench isolation layer comprises a void therein at a location within the opening in the semiconductor wafer substrate assembly;
   removing the vertical spacing layer such that the trench isolation layer comprises a portion which protrudes from a surface of the semiconductor wafer substrate assembly;
   forming an epitaxial layer over the semiconductor wafer substrate assembly which is laterally located from the trench isolation layer;
   forming a gate dielectric layer over the epitaxial layer; and
   forming a transistor gate over the gate dielectric layer.

2. The method of claim 1 further comprising forming the epitaxial layer having an upper surface, wherein the upper surface of the epitaxial layer is closer to the at least a portion of the semiconductor wafer than an upper surface of the trench isolation layer.

3. The method of claim 1 further comprising forming the epitaxial layer having an upper surface, wherein the upper surface of the epitaxial layer is about the same distance from the at least a portion of the semiconductor wafer as an upper surface of the trench isolation layer.

4. The method of claim 1 wherein a first distance from the void in the trench isolation layer to a bottom surface of the epitaxial layer is less than a second distance from the void in the trench isolation layer to the gate dielectric layer.

5. The method of claim 1 further comprising forming the epitaxial layer to have a rounded or conical profile.

6. The method of claim 1 further comprising etching the at least one opening through the vertical spacing layer and at least partially into the semiconductor wafer substrate assembly to have a width less than about 50 nanometers and an aspect ratio of at least 4:1.

7. The method of claim 1 further comprising forming the vertical spacing layer to a thickness of between about 250 angstroms and about 1,000 angstroms.

8. A method for use during fabrication of a semiconductor device, comprising:
   providing a semiconductor wafer substrate assembly comprising a semiconductor wafer;
   forming a vertical spacing layer over the semiconductor wafer;
   etching through the vertical spacing layer and at least partially into the semiconductor wafer to form at least first and second openings through the vertical spacing layer and at least first and second laterally spaced openings in the semiconductor wafer;
   forming a trench isolation layer in the at least first and second openings through the vertical spacing layer and into the at least first and second laterally spaced openings in the semiconductor wafer, wherein the trench isolation layer comprises at least one void within each of the at least first and second laterally spaced openings in the semiconductor wafer;
   removing the vertical spacing layer to expose the semiconductor wafer and to result in the trench isolation layer within the first and second laterally spaced openings in the semiconductor wafer protruding from a surface of the semiconductor wafer;

forming an epitaxial layer on the semiconductor wafer at a location between the trench isolation layer in the first and second openings; and forming at least first, second, and third transistors, wherein the first transistor at least partially overlies the trench isolation layer within the first opening in the semiconductor wafer, the second transistor at least partially overlies the trench isolation layer within the second opening in the semiconductor wafer, and the third transistor overlies the epitaxial layer between the trench isolation in the first and second openings overlies neither the trench isolation layer within the first nor the second opening in the semiconductor wafer.

9. The method of claim 8 further comprising forming a gate dielectric layer over the epitaxial layer between trench isolation layer in the first and second openings, wherein a first distance from a top of each void in the trench isolation layer in each of the first and second openings in the semiconductor wafer to a bottom surface of the epitaxial layer is less than a second distance from the top of each void to a bottom of the gate dielectric layer.

10. The method of claim 8 further comprising forming the vertical spacing layer to a thickness of between about 250 angstroms and about 1,000 angstroms.

11. The method of claim 8 further comprising forming the vertical spacing layer to a thickness of about 1,000 angstroms.

12. A semiconductor device comprising:

a semiconductor wafer section having an opening therein;

an epitaxial layer having an opening therein congruent with the opening in the semiconductor wafer section and comprising a conductively doped region which provides a transistor channel;

a trench isolation layer within the opening in the semiconductor wafer section and within the opening in the epitaxial layer, the trench isolation layer comprising a void therein;

a transistor gate dielectric layer on the epitaxial layer; and a transistor gate on the gate dielectric layer.

13. The semiconductor device of claim 12 further comprising:

a major surface of the semiconductor wafer section; and a bottom surface of the gate dielectric layer, wherein the void in the trench isolation layer is closer to the major surface of the semiconductor wafer section than to the bottom surface of the gate dielectric layer.

14. The semiconductor device of claim 12 wherein the epitaxial layer exhibits a conical or rounded profile.

* * * * *